US006376318B1

United States Patent
Lee et al.

(10) Patent No.: US 6,376,318 B1
(45) Date of Patent: Apr. 23, 2002

(54) METHOD OF MANUFACTURING A SEMICONDUCTOR DEVICE

(75) Inventors: Jung Ho Lee, Seoul; Seung Chul Lee, Kyungki-do, both of (KR)

(73) Assignee: Hyundai Electronics Industries Co., Ltd., Kyungki-do (KR)

(*) Notice: Subject to any disclaimer, the term of this patent is extended or adjusted under 35 U.S.C. 154(b) by 50 days.

(21) Appl. No.: 09/609,531

(22) Filed: Jun. 30, 2000

(30) Foreign Application Priority Data

Jun. 30, 1999 (KR) .............................. 99-25760

(51) Int. Cl.[7] .......................................... H01C 21/336
(52) U.S. Cl. ...................................................... 438/300
(58) Field of Search ................................ 438/197, 300, 438/301, 303

(56) References Cited

U.S. PATENT DOCUMENTS

| | | | |
|---|---|---|---|
| 4,728,623 A | 3/1988 | Lu et al. .................. 437/52 |
| 4,738,937 A | 4/1988 | Parsons ................... 437/180 |
| 4,918,029 A | 4/1990 | Kim ........................ 437/119 |
| 5,004,702 A | 4/1991 | Samata et al. ........... 437/57 |
| 5,030,583 A | 7/1991 | Beetz ....................... 437/39 |
| 5,032,538 A | 7/1991 | Bozler et al. ............. 437/83 |
| 5,045,494 A | 9/1991 | Choi et al. ............... 437/60 |
| 5,272,109 A | 12/1993 | Motoda ................... 437/129 |
| 5,322,802 A | 6/1994 | Baliga et al. ............ 437/22 |
| 5,322,814 A | 6/1994 | Rouse et al. ............. 437/110 |
| 5,378,652 A | 1/1995 | Samata et al. ........... 437/189 |
| 5,432,121 A | 7/1995 | Chan et al. .............. 437/95 |
| 5,435,856 A | 7/1995 | Rouse et al. ............. 136/225 |
| 5,494,837 A | 2/1996 | Subramanian et al. .... 437/34 |
| 5,508,225 A | 4/1996 | Kadoiwa .................. 437/129 |
| 5,567,652 A | 10/1996 | Nishio ..................... 437/200 |
| 5,599,724 A | 2/1997 | Yoshida ................... 437/40 |
| 5,627,102 A | 5/1997 | Shinriki et al. .......... 437/192 |
| 5,633,201 A | 5/1997 | Choi ........................ 438/620 |
| 5,744,377 A | 4/1998 | Sekiguchi et al. ....... 438/674 |
| 5,773,350 A | 6/1998 | Herbert et al. .......... 438/364 |
| 5,804,470 A | 9/1998 | Wollesen ................. 438/141 |
| 5,843,826 A * | 12/1998 | Hong ....................... 438/300 |
| 5,902,125 A * | 5/1999 | Wu .......................... 438/300 |
| 5,962,895 A * | 10/1999 | Beyer et al. ............. 257/347 |
| 6,261,911 B1 * | 7/2001 | Lee et al. ................ 438/300 |
| 6,277,677 B1 * | 8/2001 | Lee .......................... 438/142 |
| 6,281,085 B1 * | 8/2001 | Yeo .......................... 438/303 |

FOREIGN PATENT DOCUMENTS

| | | |
|---|---|---|
| JP | 54-158880 | 12/1979 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

* cited by examiner

*Primary Examiner*—David Nelms
*Assistant Examiner*—Quoc Hoang
(74) *Attorney, Agent, or Firm*—Pennie & Edmonds LLP

(57) ABSTRACT

There is disclosed a method of manufacturing a semiconductor device ion by which an epitaxial growth film into which boron is doped in-situ is formed before a gate oxide film is formed after formation a well region for forming a MOS device and using it as a channel threshold voltage control layer, thus forming a counter-doped boron layer having an uniform and still higher concentration than the threshold voltage control layer formed by the conventional ion implantation process at the surface of the silicon substrate. As a result, it can make a device having a more sharp profile of the threshold voltage profile at the channel and having an improved short channel characteristic by the combination of the channel and junction engineering.

26 Claims, 6 Drawing Sheets

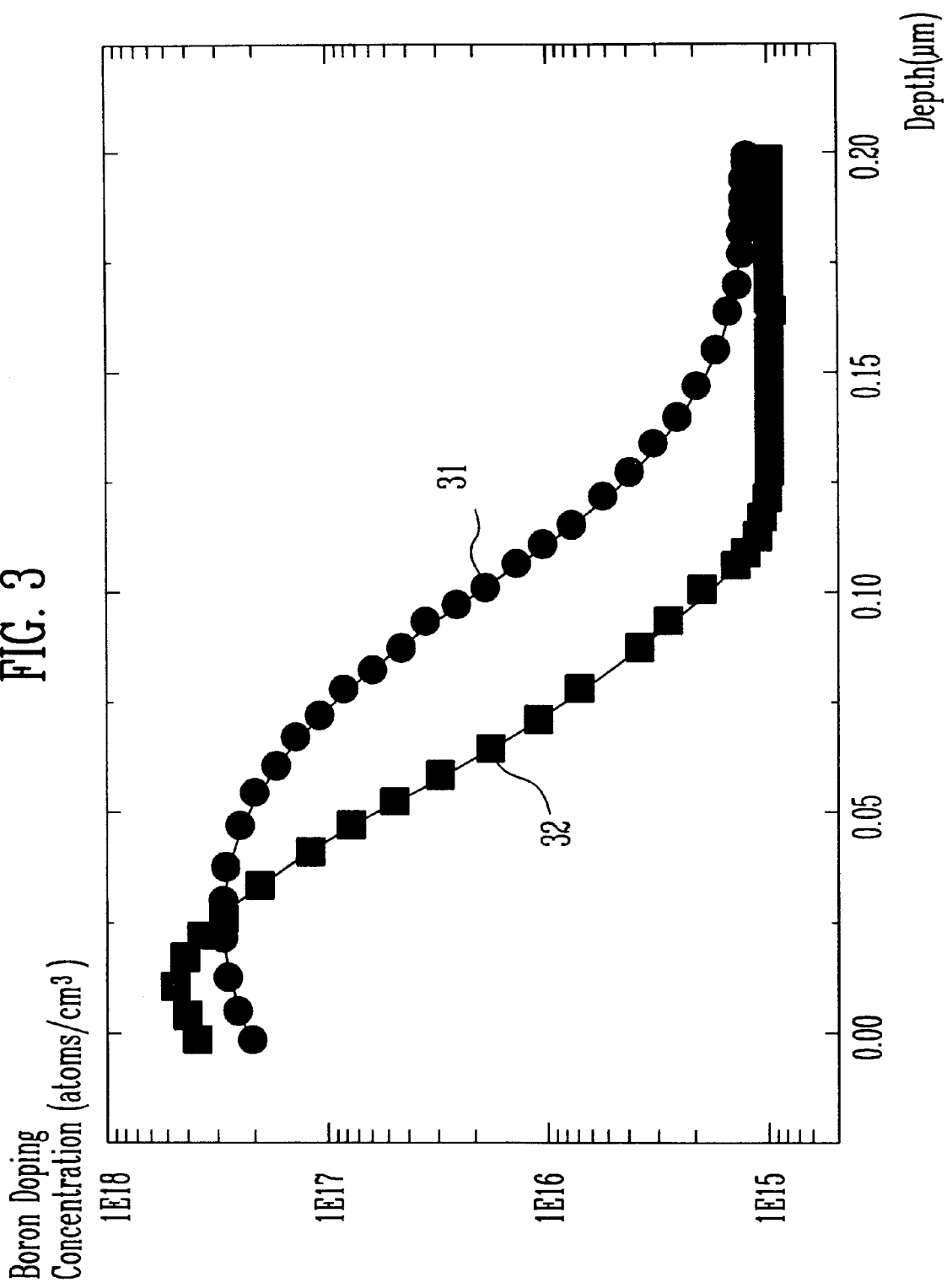

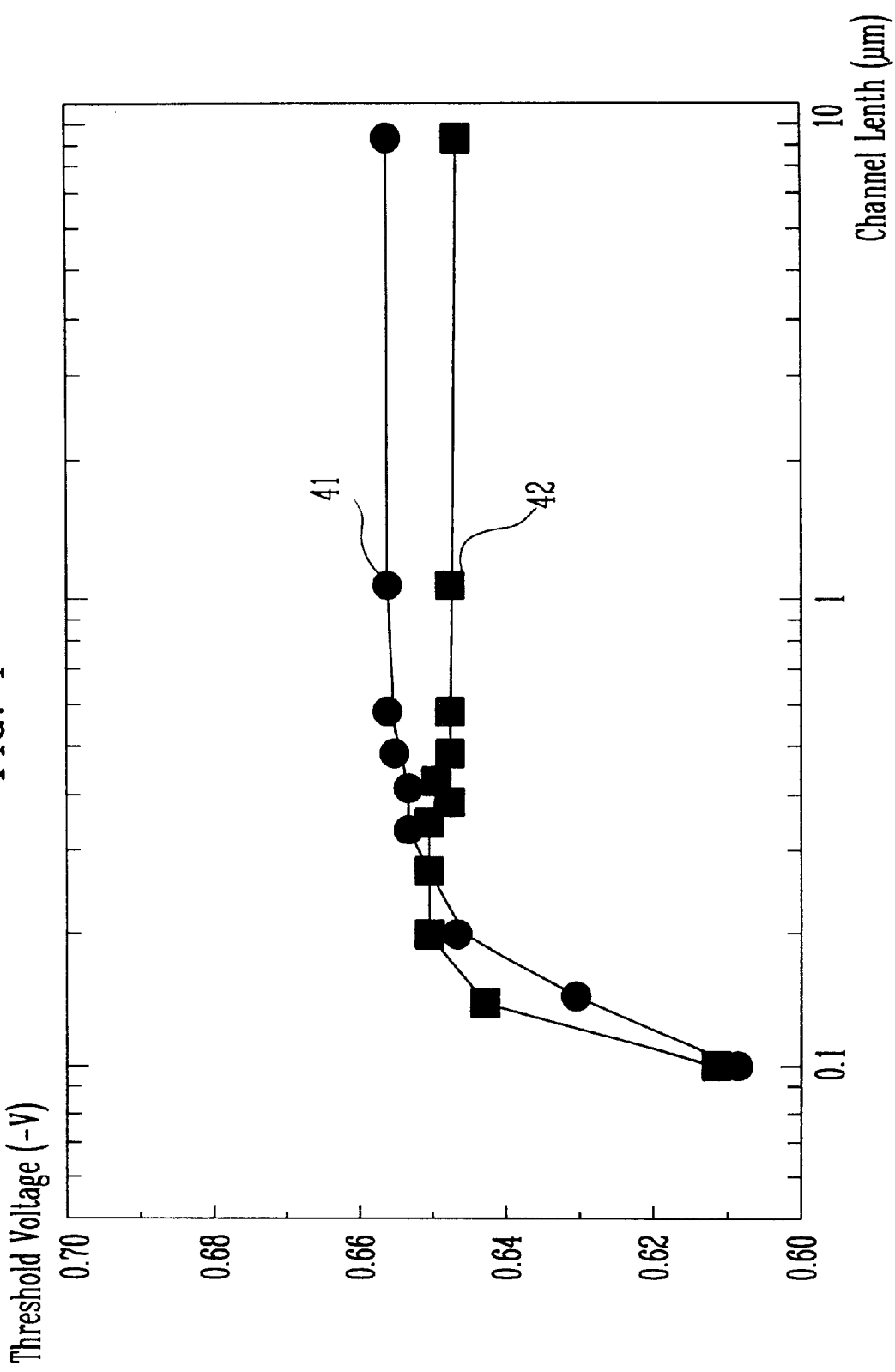

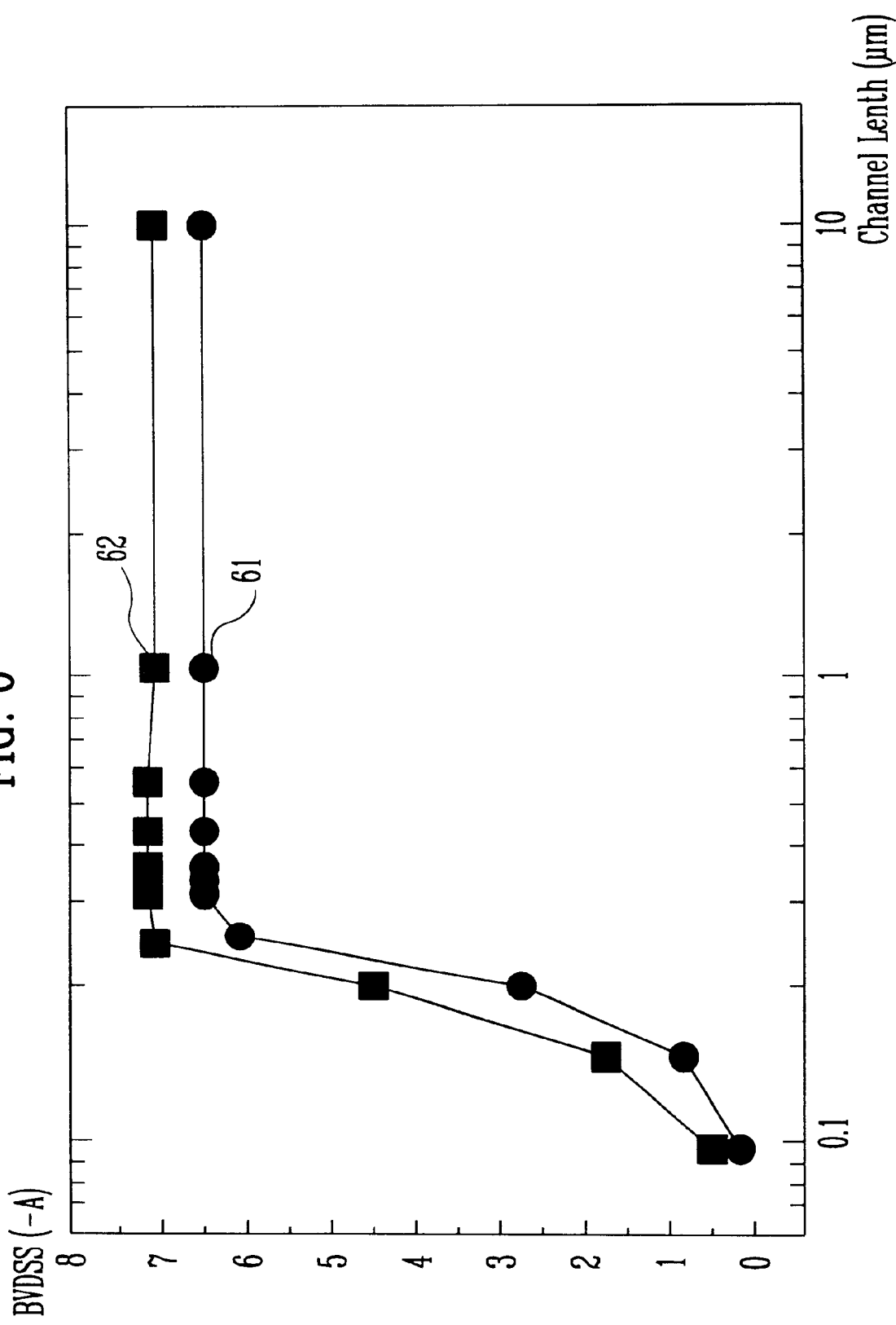

METHOD OF MANUFACTURING A SEMICONDUCTOR DEVICE

BACKGROUND OF THE INVENTION

1. Field of the Invention

The invention relates generally to a method of manufacturing a semiconductor device, and more particularly to, a method of manufacturing a semiconductor device capable of improving the short channel effect of the device, by which a selective epitaxial growth film into which boron having an uniform and high concentration is doped is formed under a gate oxide film, when forming an elevated source/drain (ESD) structure using a selective epitaxial growth (called SEG hereinafter) technology.

2. Description of the Prior Art

In a semiconductor device of a buried channel PMOS elevated source/drain structure having a conventional self-aligned epitaxial silicon sliver (called SESS hereinafter), its facets can be prohibited at a maximum and thus the junction depth neighboring to the channel can be easily reduced by employing the threshold voltage Vt control method by means of ion implantation. Thus, it can improve the short channel characteristic of the device.

FIGS. 1A through 1D are sectional views of devices sequentially showing to illustrate a method of manufacturing a conventional semiconductor device. The case of forming the PMOS will be below explained as an example.

FIG. 1A shows the state in which a device separation film 12 is formed on a silicon substrate 11 and an N-well region is formed thereon for forming a PMOS.

Referring to FIG. 1B, after an ion implantation region for controlling the threshold voltage 13 is formed by means of ion implantation process for controlling the threshold voltage Vt, a gate oxide film 14 is formed. Then, a gate electrode 15 and a mask oxide film 16 are sequentially formed on the entire structure. Thereafter, the mask oxide film 16, the gate electrode 15 and the gate oxide film 14 are patterned.

Then, as shown in FIG. 1C, an oxide film and a nitride film are sequentially formed on the entire structure. Next, a dual spacer structure formed of an oxide film spacer 17 and a nitride film spacer 18 is formed at the sidewalls of the patterned structure by means of blanket etching process. Thereafter, an epitaxial layer 19 is selectively formed on the exposed silicon substrate 11 by chemical vapor deposition. At this time, upon growth of the epitaxial layer 19, a self-aligned silicon growth is made toward the SESS A.

FIG. 1D show the state in which ion implantation process and annealing process are performed to activate the dopants and some of the implanted dopants are diffused into the substrate, thus forming an elevated source and drain regions S and D.

In case of forming the buried PMOS elevated source/drain structure in this manner, the depth of the junctions S, D neighboring to the channel can be easily reduced because generation of facets B is prohibited as possible. Accordingly, though it can improve the short channel characteristic of the device can be improved to a certain extent, the profile of the ion implanted threshold voltage is not improved compared to that of the convention device. Thus, it can be seen that the short channel characteristic is improved by the junction engineering, not the channel engineering.

If the integration degree of the device becomes higher, there is a problem that it has a limitation in improving the short channel characteristic only by this junction engineering. Therefore, there is required a method of basically improving the channel characteristic only by the channel engineering.

SUMMARY OF THE INVENTION

It is therefore an object of the present invention to provide a method of manufacturing a semiconductor device capable of improving the channel characteristic of a device, by which a selective epitaxial layer into which boron is doped is in-situ grown to form the counter-doped boron layer of the uniform and still higher concentration than the ion implantation layer for controlling the threshold voltage.

In order to accomplish the above object, the method of manufacturing a semiconductor device according to the present invention is characterized in that it comprises the steps of forming a device separation film on a silicon substrate and then forming a n-well region for forming a PMOS device; forming a selective epitaxial growth film into which boron is doped on said silicon substrate; sequentially forming a gate oxide film, a gate electrode and a mask oxide film on the entire structure and then patterning selected regions of said mask oxide film, said gate electrode and said gate oxide film to obtain a gate region; forming a oxide film and a nitride film on the entire structure and then forming a double spacer made of a oxide film spacer and a nitride film spacer at the sidewalls of the patterned structure by blanket etching process; forming a selective epitaxial growth film on said exposed silicon substrate; and performing ion implantation process for said selective epitaxial growth film and then diffusing dopants into said silicon substrate by annealing process, thus forming an elevated source and drain region.

BRIEF DESCRIPTION OF THE DRAWINGS

The aforementioned aspects and other features of the present invention will be explained in the following description, taken in conjunction with the accompanying drawings, wherein:

FIGS. 2A through 1D are sectional views of devices sequentially showing to illustrate a method of manufacturing a semiconductor device according to the present invention;

FIG. 3 is a graph showing the relationship between the concentration degree and doping depth of boron depending on whether the epitaxial growth channel is applied or not;

FIG. 4 is a graph showing the relationship between the channel length and threshold voltage depending on whether the epitaxial growth channel is applied or not;

FIG. 6 is a graph showing the relationship between the channel length and channel punch-through voltage depending on whether the epitaxial growth channel is applied or not.

DETAILED DESCRIPTION OF PREFERRED EMBODIMENTS

Figure 1A:
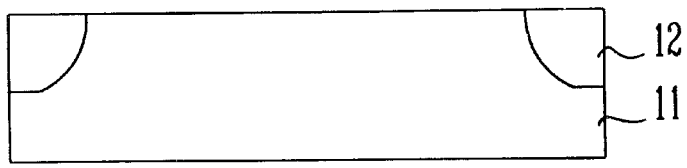
FIGS. 1A through 1D are sectional views of devices sequentially showing to illustrate a method of manufacturing a conventional semiconductor device.
Figure 1B:
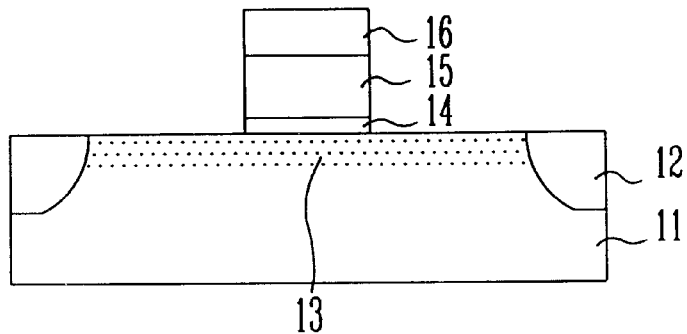
Figure 1C:
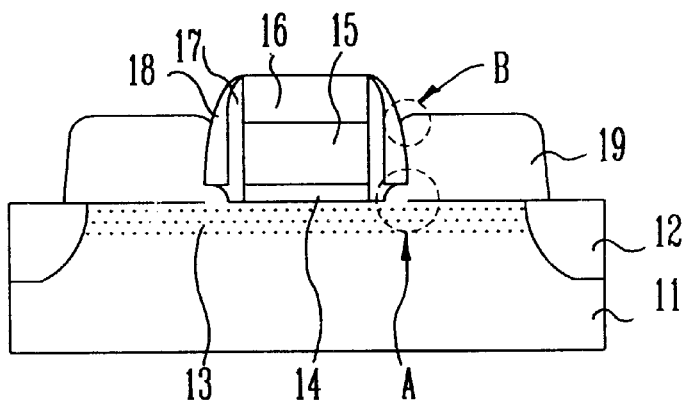
Figure 1D:
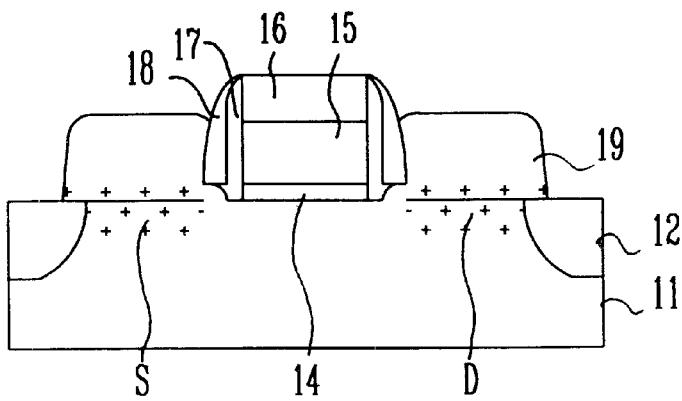

The present invention will be described in detail by way of a preferred embodiment with reference to accompanying drawings, in which like reference numerals are used to identify the same or similar parts.

The present invention forms a well region for forming a MOS, selectively forming an epitaxial growth film into which boron is in-situ doped before forming a gate oxide film, and then use it to control a channel threshold voltage.

This method allows a counter-doped boron layer to be formed at its surface at a uniform and still higher concentration than the threshold voltage control layer. Accordingly, the device manufactured by the present invention has the advantages that the profile of the threshold voltage at the channel region becomes further sharper and the device' short channel characteristic is further improved by means of the combination of the channel and junction engineering.

FIGS. 2A through 2D are sectional views of devices sequentially showing to illustrate a method of manufacturing a semiconductor device according to the present invention.

Figure 2A:
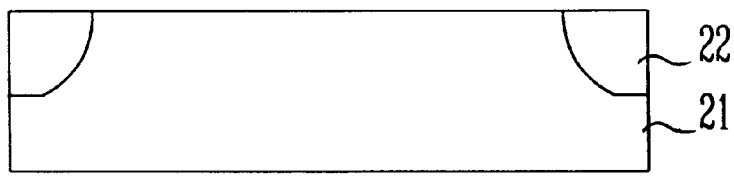

FIG. 2A shows the state in which a device separation film 22 is formed on a silicon substrate 21 and an N-well region is formed thereon for forming a PMOS. The N-well region is formed by implanting phosphorus of $1 \times 10^{13}$ through $3 \times 10^{13}$ ions/cm$^2$ at the energy of 800 through 1200 keV and then annealing process at the temperature of 900 through 1000° C. for 25 through 35 minutes using a furnace to activate the dopants.

Figure 2B:
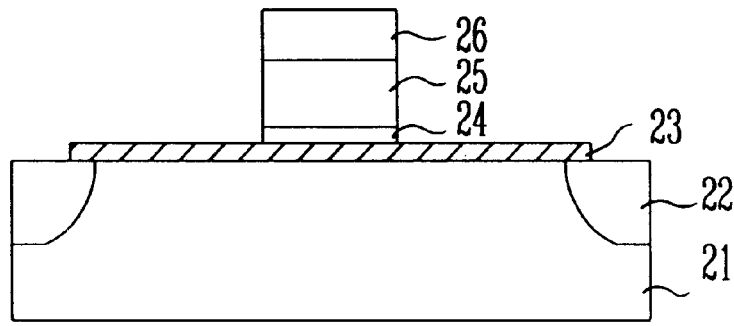

As shown in FIG. 2B, after cleaning process for removing a native oxide film grown on the silicon substrate 21 is performed, a selective epitaxial growth film 23 into which boron is doped is formed in order to control the threshold voltage of the channel and then a gate oxide film 24 is grown. Then, the cleaning process is sequentially proceeded with ex-situ process and in-situ process. In case of performing the ex-situ process, RCA cleaning or a mixture process of UV-O$_3$ cleaning and HF dipping cleaning is used. However, in case of performing the in-situ process, hydrogen bake is performed at the temperature of 800 through 900° C. for about 1 through 5 minutes. Thereafter, a gate electrode 25 and a mask oxide film 26 are sequentially formed on the entire structure. The mask oxide film 26, the gate electrode 25 and the gate oxide film 24 of a selected region are patterned to form a gate region. The epitaxial growth film 23 into which boron is doped is formed in-situ by a low pressure chemical vapor deposition method, wherein its thickness is 100 through 200 Angstrom and the doping concentration is $3 \times 10^{12}$ through $7 \times 10^{12}$ ion/cm$^2$. Also, the deposition gases use dichlorosilane (DCS) and hydrochloric acid (HCl), wherein the amount of flow of DCS is 30 through 300 sccm, the amount of flow of HCl is 30 through 200 sccm and B$_2$H$_6$ is flowed about 100 through 300 sccm as doping gas. Then, the deposition pressure is 5 through 50 Torr and the deposition temperature is 750 through 950° C.

In this manner, the method of controlling the threshold voltage control layer can obtain the threshold voltage characteristic having a more shaper profile than the method by which the threshold voltage control layer is formed by ion implantation.

Figure 2C:
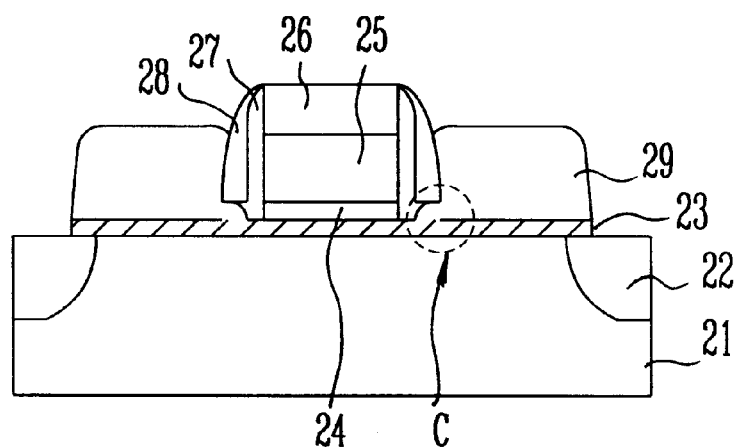

As shown in FIG. 2C, an oxide film and a nitride film are formed on the entire structure. Next, a dual spacer structure formed of an oxide film spacer 27 and a nitride film spacer 28 is formed at the sidewalls of the patterned structure by means of blanket etching process. At this time, the oxide film is formed at the thickness of 100 through 300 Angstrom and the nitride film is formed at the thickness of 200 through 500 Angstrom. Then, an epitaxial layer 29 is selectively formed on the exposed silicon substrate 21 by a chemical vapor deposition method. The selective epitaxial growth film 29 is an undoped silicon film and is formed at the thickness of 800 through 2000 Angstrom. The selective epitaxial growth film 29 is formed in-situ using a chemical vapor deposition method. At this time, the deposition gases use dichlorosilane (DCS) and hydrochloric acid (HCl), wherein the amount of flow of DCS is 30 through 300 sccm and the amount of flow of HCl is 30 through 200 sccm. Also, the deposition pressure is 5 through 50 Torr and the deposition temperature is 750 through 950° C.

At this time, upon growth of the epitaxial layer 29, a self-aligned silicon growth is made toward the SESS C. Before the selective epitaxial growth film 29 is formed, cleaning process for removing a native oxide film etc. on the surface is performed. The cleaning process is sequentially proceeded with ex-situ process and in-situ process. In case of performing the ex-situ process, RCA cleaning or a mixture process of UV-O$_3$ cleaning and HF dipping cleaning is used. However, in case of performing the in-situ process, hydrogen bake is performed at the temperature of 800 through 900° C. for about 1 through 5 minutes.

Figure 2D:
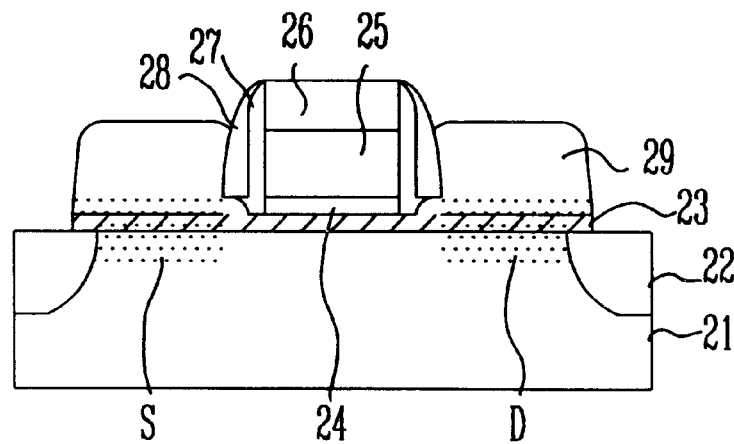

FIG. 2D is a sectional view of the device in which ion implantation process and annealing process are performed to activate the dopants and some of the implanted dopants are diffused into the silicon substrate 21, thus forming elevated source and drain regions S and D. The ion implantation for forming the source and drain regions S and D are performed using BF$_2$ as dopants at the energy of 10 through 60 keV at the concentration of about $1 \times 10^{15}$ through $5 \times 10^{15}$ ions/cm$^2$.

Figure 5:
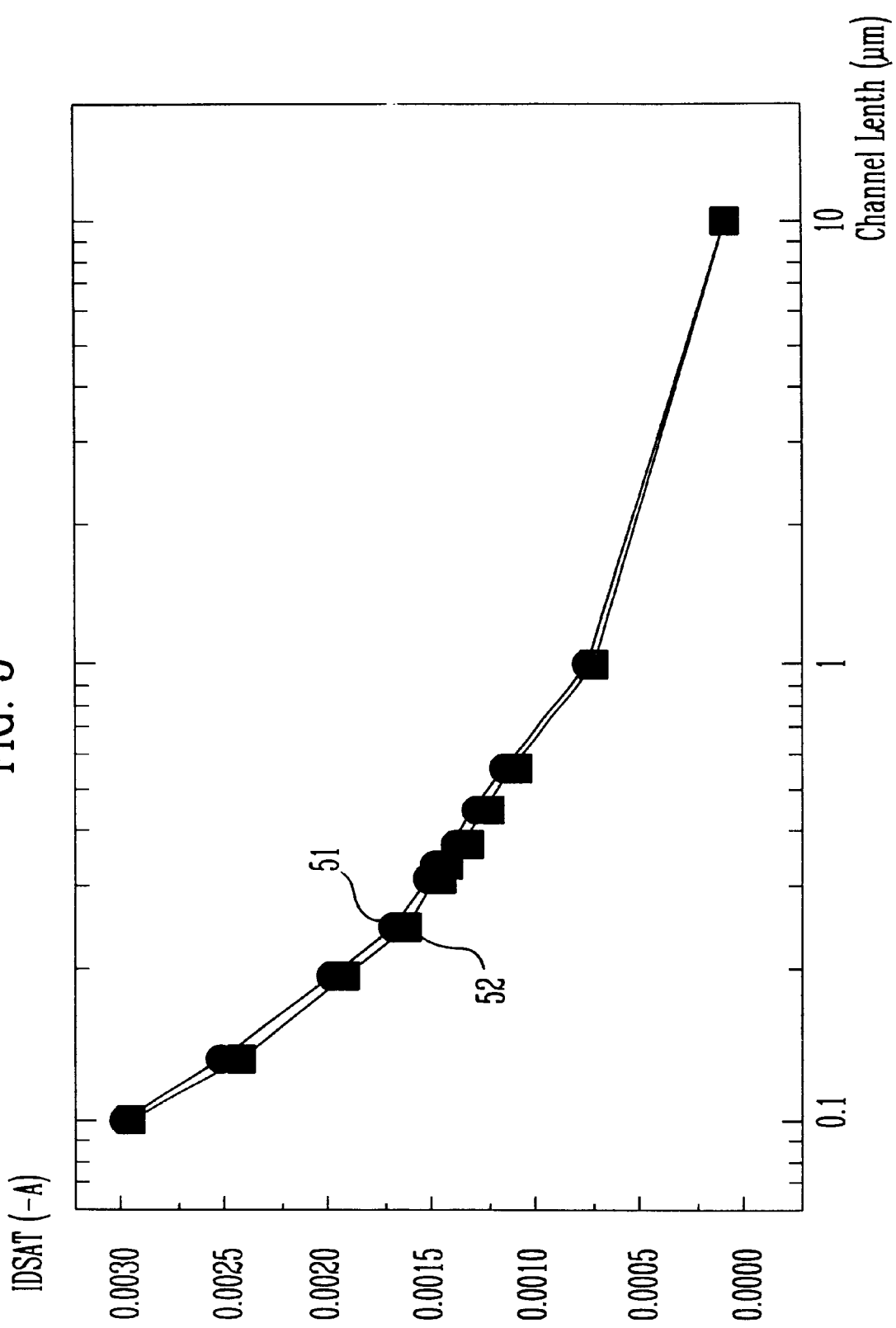
FIG. 5 is a graph showing the relationship between the channel length and saturation current density depending on whether the epitaxial growth channel is applied or not.

FIG. 3 is a graph showing the relationship between the concentration degree and doping depth of boron depending on whether the epitaxial growth channel is applied or not, and FIG. 4 is a graph showing the relationship between the channel length and threshold voltage depending on whether the epitaxial growth channel is applied or not. Also, FIG. 5 is a graph showing the relationship between the channel length and saturation current density depending on whether the epitaxial growth channel is applied or not, and FIG. 6 is a graph showing the relationship between the channel length and channel punch-through voltage depending on whether the epitaxial growth channel is applied or not.

As can be seen from FIG. 3, when comparing the boron doping concentrations, if the epitaxial growth channel structure and the elevated source/drain structure are simultaneously applied (marked 32) as in the present invention, more sharper and thinner channel layers can be formed compared to the threshold voltage layer (marked 31) formed by the conventional ion implantation. As same in FIGS. 4 through 6, the case that the epitaxial growth channel structure and the elevated source/drain structure are simultaneously applied (marked 42, 52, 62) not only can improve the roll-off characteristic of the threshold voltage compared to the case that only the elevated source/drain structure is applied, but also can improve the punch-through characteristic in less 0.2 μm even under almost same saturation current density.

As a result, the present invention can obtain a buried channel MOS device having an improved channel characteristic by simultaneously applying the channel and junction engineering.

As described above, the present invention can obtain the counter-doped boron layer of the uniform and still higher concentration than, by growing the selective epitaxial layer into which boron is in-situ doped before the gate oxide film is formed, and using it to control the channel threshold voltage, compared to that the buried channel-PMOS elevated source/drain structure having the SESS structure improves its short channel characteristic by the junction engineering. Therefore, the present invention has an outstanding effect that it can make a device having its profile of the threshold voltage profile at the channel more sharper and having an improved short channel characteristic by the combination of the channel and junction engineering.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:

forming a device separation film on a silicon substrate and then forming an N-well region for forming a PMOS device;

forming a first selective epitaxial growth film into which boron is doped on said silicon substrate to thereby control a threshold voltage of a channel;

sequentially forming a gate oxide film, a gate electrode and a mask oxide film on the entire structure and then patterning selected regions of said mask oxide film, said gate electrode and said gate oxide film to obtain a gate region;

forming a oxide film and a nitride film on the entire structure and then forming a double spacer made of a oxide film spacer and a nitride film spacer at the sidewalls of the patterned structure by blanket etching process;

forming a second selective epitaxial growth film on said exposed silicon substrate; and performing ion implantation process for said first and second selective epitaxial growth film and then diffusing dopant into said silicon substrate by annealing process, thus forming an elevated source and drain region.

2. The method of manufacturing a semiconductor device according to claim 1, wherein said N-well region is formed by implanting phosphorus of $1 \times 10^{13}$ through $3 \times 10^{13}$ ions/cm$^2$ at the energy of 800 through 1200 keV, and then annealing them at the temperature of 900 through 1000° C. for 25 through 35 minutes using a furnace.

3. The method of manufacturing a semiconductor device according to claim 1, wherein said first selective epitaxial growth film into which boron is doped, is formed by a low pressure chemical vapor deposition method.

4. The method of manufacturing a semiconductor device according to claim 1, wherein said first selective epitaxial growth film into which boron is doped, is formed in-situ.

5. The method of manufacturing a semiconductor device according to claim 1, said first selective epitaxial growth film into which boron is doped, is formed in thickness of 100 through 200 Angstrom.

6. The method of manufacturing a semiconductor device according to claim 1, wherein said first selective epitaxial growth film into which boron is doped, is formed with doping concentration of $3 \times 10^{12}$ through $7 \times 10^{12}$ ions/cm$^2$.

7. The method of manufacturing a semiconductor device according to claim 1, wherein said first selective epitaxial growth film into which boron is doped, uses dichlorosilane and hydrochloric acid as deposition gases.

8. The method of manufacturing a semiconductor device according to claim 7, wherein the flow amount of said dichlorosilane is 30 through 300 sccm and the flow amount of said hydrochloric acid is 30 through 200 sccm.

9. The method of manufacturing a semiconductor device according to claim 1, wherein said first selective epitaxial growth film into which boron is doped, uses $B_2H_6$ of 100 through 300 sccm as doping gas.

10. The method of manufacturing a semiconductor device according to claim 1, wherein said first selective epitaxial growth film into which boron is doped, is formed under the conditions having the pressure of 5 through 50 Torr and the temperature of 750 through 950° C.

11. The method of manufacturing a semiconductor device according to claim 1, wherein said oxide film is formed in thickness of 100 through 300 Angstrom, and said nitride film is formed in thickness of 200 through 500 Angstrom.

12. The method of manufacturing a semiconductor device according to claim 1, wherein said second selective epitaxial growth film grown on said silicon substrate after forming said double spacer is an undoped silicon film.

13. The method of manufacturing a semiconductor device according to claim 12, wherein said second selective epitaxial growth film is formed in thickness of 800 through 2000 Angstrom.

14. The method of manufacturing a semiconductor device according to claim 12, wherein said second selective epitaxial growth film is formed in-situ using a low pressure chemical vapor deposition method.

15. The method of manufacturing a semiconductor device according to claim 12, wherein said second selective epitaxial growth film is formed in-situ using dichlorosilane and hydrochloric acid as deposition gases.

16. The method of manufacturing a semiconductor device according to claim 15, wherein the flow amount of said dichlorosilane is 30 through 300 sccm and the flow amount of said hydrochloric acid is 30 through 200 sccm.

17. The method of manufacturing a semiconductor device according to claim 12, wherein said second selective epitaxial growth film is formed under the conditions having the pressure of 5 through 50 Torr and the temperature of 750 through 950° C.

18. The method of manufacturing a semiconductor device according to claim 1, wherein the ion implantation process for forming said source and drain region employs the concentration of $1 \times 10^{15}$ through $5 \times 10^{15}$ ion/cm$^2$ at the energy of 10 through 60 keV using $BF_2$ as dopants.

19. The method of manufacturing a semiconductor device according to claim 1, wherein, after forming said N-well region, further comprising performing a first cleaning process for removing a native oxide film grown on said silicon substrate, and a second cleaning process for said exposed entire surface after formation of said double spacer.

20. The method of manufacturing a semiconductor device according to claim 19, wherein said first cleaning process is performed in-situ or ex-situ.

21. The method of manufacturing a semiconductor device according to claim 19, wherein said first cleaning process is performed ex-situ using a RCA cleaning or a mixture of UV-$O_3$ cleaning and HF cleaning.

22. The method of manufacturing a semiconductor device according to claim 19, wherein said first cleaning process is in-situ by performing a hydrogen bake at the temperature of 800 through 900° C. for 1 through 5 minutes.

23. The method of manufacturing a semiconductor device according to claim 19, wherein said second cleaning process is performed in-situ or ex-situ.

24. The method of manufacturing a semiconductor device according to claim 19, wherein said second cleaning process is performed ex-situ using a RCA cleaning or a mixture of UV-$O_3$ cleaning and HF cleaning.

25. The method of manufacturing a semiconductor device according to claim 19, wherein said second cleaning process is in-situ by performing a hydrogen bake at the temperature of 800 through 900° C. for 1 through 5 minutes.

26. A method of manufacturing a semiconductor device, comprising the steps of:

forming a device separation film on a silicon substrate and then forming an N-well region for forming a PMOS device;

forming a first selective epitaxial growth film into which boron is doped on said silicon substrate;

sequentially forming a gate oxide film, a gate electrode and a mask oxide film on the entire structure and then patterning selected regions of said mask oxide film, said gate electrode and said gate oxide film to obtain a gate region;

forming an oxide film and a nitride film on the entire structure and then forming a double spacer made of an oxide film spacer and a nitride film spacer at the sidewalls of the patterned structure by blanket etching process;

forming a second selective epitaxial growth film above the first selective growth film; and performing ion implantation process in said first and second selective epitaxial growth films to thereby form an elevated source and drain region.

\* \* \* \* \*